United States Patent
Olander

(10) Patent No.: US 6,868,869 B2
(45) Date of Patent: Mar. 22, 2005

(54) SUB-ATMOSPHERIC PRESSURE DELIVERY OF LIQUIDS, SOLIDS AND LOW VAPOR PRESSURE GASES

(75) Inventor: W. Karl Olander, Indian Shores, FL (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/369,829

(22) Filed: Feb. 19, 2003

(65) Prior Publication Data

US 2004/0159005 A1 Aug. 19, 2004

(51) Int. Cl.[7] .............................................. C23C 16/00
(52) U.S. Cl. ...................... 137/888; 392/386; 392/400; 392/401; 118/692; 118/697; 118/712; 118/726
(58) Field of Search ................................ 118/692, 697, 118/712, 726; 392/386, 400, 401; 137/888

(56) References Cited

U.S. PATENT DOCUMENTS

| | | | | |
|---|---|---|---|---|
| 3,658,304 A | * | 4/1972 | Hall et al. .................. 261/23.1 |
| 4,439,463 A | * | 3/1984 | Miller ......................... 427/563 |
| 5,221,352 A | * | 6/1993 | Terneu et al. ................ 118/718 |
| 5,445,035 A | * | 8/1995 | Delajoud .................. 73/861.52 |
| 5,534,073 A | * | 7/1996 | Kinoshita et al. ............ 118/728 |
| 5,935,305 A | * | 8/1999 | Tom et al. ...................... 96/143 |
| 6,089,027 A | * | 7/2000 | Wang et al. .................. 62/46.1 |
| 6,216,726 B1 | * | 4/2001 | Brown et al. ................ 137/486 |
| 6,217,659 B1 | * | 4/2001 | Botelho et al. .............. 118/715 |
| 6,257,000 B1 | * | 7/2001 | Wang .......................... 62/48.1 |
| 6,572,706 B1 | * | 6/2003 | Nguyen et al. .............. 118/724 |
| 6,620,225 B2 | * | 9/2003 | Wang et al. ................... 96/108 |
| 2002/0007849 A1 | * | 1/2002 | Want et al. .................. 137/263 |
| 2002/0054956 A1 | * | 5/2002 | Botelho et al. .............. 427/214 |

* cited by examiner

Primary Examiner—Richard Bueker
(74) Attorney, Agent, or Firm—Margaret Chappuis; Steven Hulquist, Esq.

(57) ABSTRACT

A delivery system and method for vaporizing and delivery of vaporized solid and liquid precursor materials at sub-atmospheric pressures between a heatable vaporization vessel and a processing tool. The system includes a pressure regulator internally positioned within the vaporization vessel and in fluid communication with a downstream mass flow controller to maintain a consistent flow of vaporized source material. The system further comprises introducing a carrier/diluent gas for diluting the vaporized source material before entry into the processing tool. A venturi is positioned directly upstream of the processing tool and provides for mixing of the carrier gas with the vaporized source material while providing the negative pressure required to open the gas pressure regulator within the vaporization vessel.

12 Claims, 3 Drawing Sheets

SUB-ATMOSPHERIC PRESSURE DELIVERY OF LIQUIDS, SOLIDS AND LOW VAPOR PRESSURE GASES

BACKGROUND OF INVENTION

1. Field of the Invention

The present invention relates to a vapor delivery system and method of use, and more particularly, to a delivery system for vaporized liquids, solids or low vapor pressure gases at sub-atmospheric pressures for use in metalorganic chemical vapor deposition (MOCVD) and chemical vapor deposition (CVD) processes.

2. Description of the Related Art

MOCVD and CVD have been extensively used for preparation of films and coatings in semiconductor wafer processing. These deposition processes are favored because of their ability to provide highly conformal and high quality films, at relatively fast processing times. Further, these deposition processes are beneficial in coating substrates of irregular shapes including the provision of highly conformal films even with respect to deep contacts and other openings.

In general, CVD techniques involve the delivery of vapor phase reactants to the surface of a substrate where chemical reactions take place under temperature and pressure conditions that are favorable to the thermodynamics of the desired reaction. Some of the gases utilized for CVD techniques originate as liquids or solids and must be evaporated and transported in their vapor state to the reaction chamber.

The type and composition of the layers that can be formed using CVD is limited by the ability to deliver the reactants or reactant precursors to the surface of the substrate. Typically, in a liquid/solid delivery system, a carrier gas is passed through a vaporizing vessel containing a low vapor pressure material. The carrier gas dissolves the material and transports the vapors to the reaction chamber. The carrier gas is typically bubbled at a controlled rate through the storage vessel so as to saturate the carrier gas with vaporized reactant and the saturated carrier gas is then transported to the reaction chamber.

However, if the low vapor pressure material is a solid material, the carrier gas can bore a hole thru the bulk material, such that, the carrier gas tunnels thru the solid material and ultimately does not maintain a consistent concentration. This can cause inconsistency in flow rates of a vaporized source material because the consistency of flow is dependent on sufficient contact of the carrier gas with the liquid or solid source materials. When inconsistencies in the flow rate occur, the flow rate and temperature can be increased but at the cost of reduced lifetime of the system. Further, additional analytical instruments must be included in the system to assure that the correct concentration is being introduced into the reaction vessel.

Accordingly, there is a need in the art for a delivery system that efficiently vaporizes solid and/or liquid precursor materials without the disadvantages of the prior art, such as condensation of vaporized precursor in the lines connecting the vaporizing chamber to the processing chamber, inconsistent vapor flow to downstream deposition systems resulting from tunneling of the carrier gases upon extended contact with the precursor material, and/or additional operating costs due to installation and maintenance of additional valves and analytical tools.

SUMMARY OF THE INVENTION

The present invention relates to a delivery system and method for vaporizing and delivery of vaporized solid or liquid precursor materials at sub-atmospheric pressures having particular utility for semiconductor manufacturing applications.

In one aspect, the present invention relates to a vapor delivery system for vaporization and sub-atmospheric delivery of a vaporized source material, comprising:

a) a vaporization vessel enclosing an interior volume, wherein the vessel includes a heating means for vaporizing a source material, a fill port for introducing source material and an outlet port for discharged vaporized source material;

b) a gas pressure regulator positioned within the vaporization vessel, wherein the gas pressure regulator is set to release vaporized source material at a predetermined subatmospheric pressure;

c) a processing tool positioned downstream from the vaporization vessel;

d) at least one connecting vapor line positioned between the vaporization vessel and processing tool and in fluid communication therewith; and e) a mass flow controller in fluid communication with the connecting vapor line to establish a flow rate of the discharged vaporized source material into the downstream processing tool.

The present embodiment may further comprise:

f) a venturi positioned between the processing tool and the mass flow controller and communicatively connected therebetween, wherein the venturi reduces the pressure in the upstream connecting vapor line to a sufficient level to actuate the gas pressure regulator for releasing vaporized source material from the vaporization vessel; and g) a carrier/diluent gas line connected to the venturi for introducing a carrier/diluent gas to the venturi thereby contacting and mixing the carrier gas with the vaporized source material before delivery to the processing tool.

The processing tool may function at a lower sub-atmospheric pressure than that set in the gas pressure regulator thereby causing the gas pressure regulator to switch on and permit the vaporized source material to flow from the vaporization vessel. In the alternative, if the pressure is higher in the processing tool, the use of a venturi will act as a vacuum generator to provide sufficiently low pressure to actuate the pressure regulator within the vaporizer vessel thereby releasing the vaporized source material. Still further, in some conditions the use of a venturi may not be adequate to sufficiently reduce the pressure in the system and the use of vacuum pump, preferably a turbo pump connected via a manifold to a storage vessel, may be utilized to reduce the pressure in the connecting line. In all the alternative ways, the present invention eliminates the need for introducing a carrier gas directly into the vaporization vessel thereby reducing the inherent problems of tunneling within the bulk material.

In another aspect, the present invention relates to a vapor delivery system for vaporization and sub-atmospheric delivery of a vaporized source material, comprising:

a) a heatable vaporization vessel for holding and heating a vaporizable source material;

b) a heatable processing tool positioned downstream and in fluid communication with the heatable vaporization vessel;

c) a connecting vapor line positioned between the vaporization vessel and processing tool and in fluid communication therewith;

d) a gas pressure regulator positioned within the vaporization vessel and in fluid communication therewith, wherein the gas pressure regulator is preset to release vaporized source material at a sensed sub-atmospheric pressure in the connecting line;

e) a mass flow controller in fluid communication with the connecting vapor line to and positioned between the vaporization vessel and processing tool to establish a flow rate of the discharged vaporized source material into the downstream processing tool;

f) a venturi positioned between the processing tool and the mass flow controller and communicatively connected therebetween for decreasing the pressure in the connecting line sufficiently to actuate the gas pressure regulator and release the vaporized source material from the vaporization vessel; and g) a carrier/diluent gas line in fluid communication with the venturi for introducing and mixing a carrier/diluent gas with the vaporized source material before delivery to the processing tool.

In yet a further aspect, the present embodiment further comprises a means for heating the connecting vapor line to reduce deposition or condensation of the vaporized source material in the connecting line.

In yet another aspect, the present invention relates to a vapor delivery system for vaporization and sub-atmospheric delivery of a vaporized source material, comprising:

a) a vaporization vessel enclosing an interior volume, wherein the vessel includes a heating means for vaporizing a source material, a fill port for introducing source material and an outlet port for discharged vaporized source material;

b) a gas pressure regulator positioned within the vaporization vessel, wherein the gas pressure regulator is set to release vaporized source material at a predetermined subatmospheric pressure;

c) a processing tool positioned downstream from the vaporization vessel;

d) at least one connecting vapor line positioned between the vaporization vessel and processing tool and in fluid communication therewith; and e) a mass flow controller in fluid communication with the connecting vapor line to establish a flow rate of the discharged vaporized source material into the downstream processing tool; and f) a vacuum pump communicatively connected to the connecting vapor line and positioned to maintain pressure within the connecting vapor line at a pressure sufficient to release source material through the gas pressure regulator.

As described more fully hereinafter, the precursor may comprise a solid or liquid source material including, but are not limited to, decaborane, hafnium tetrachloride, zirconium tetrachloride, indium trichloride, metalorganic β-diketonate complexes, tungsten hexafluoride, cyclopentadienylcycloheptatrienyl-titanium ($C_p$TiCht), aluminum trichloride, titanium iodide, cyclooctatetraenecyclopentadienyltitanium, biscyclopentadienyltitaniumdiazide, trimethyl gallium, trimethyl indium, aluminum alkyls like trimethylaluminum, triethylaluminum, trimethylamine alane, dimethyl zinc, tetramethyl tin, trimethyl antimony, diethyl cadmium and tungsten carbonyl.

In yet another aspect, the present invention provides a method for delivering a vaporized source material to a processing tool, the method comprising:

a) heating a source material in a vaporization vessel at a temperature that generates a vaporized source material at a sufficient vapor pressure without decomposition of vaporized source material;

b) releasing the vaporized source material through a gas pressure regulator, wherein the pressure regulator is positioned within the vaporization vessel and pre-set to release the vaporized source material at a sensed sub-atmospheric pressure level downstream from the vaporization vessel;

c) flowing the vaporized source material to a downstream processing tool via a connecting line;

d) adjusting the flow rate of the vaporized source material by passing through a mass flow controller positioned upstream from the processing tool; and e) mixing a carrier/diluent gas with the vaporized source material before delivery into the processing tool.

Other aspects and features of the invention will be more fully apparent from the ensuing disclosure and appended claims.

DETAILED DESCRIPTION OF THE INVENTION AND PREFERRED EMBODIMENTS THEREOF

The present invention is based on the discovery that delivery of a vaporized source material to a processing tool is optimized by flowing the vaporized source material between the vaporization vessel and the processing tool through a pressure differential, wherein the pressure of the vaporized source material leaving the vaporization vessel is at a higher subatmospheric pressure value than that downstream of the vaporization vessel. If the pressure differential is sufficient the need for a carrier gas and/or trace heating connecting flow lines may be eliminated. Further, the delivery system of the present invention, operating at sub-atmospheric pressures, introduces additional safety and control advantages. As the system is operated under a vacuum, releases—should they occur—are contained within the delivery system, and as such, exposure to workers from such incidents related to loss of integrity of the flow circuit system is almost non-existent. Additionally, it is not necessary to flow a carrier gas through the vaporization vessel thereby eliminating any tunneling effects into the source material and providing for a more consistent concentration of the vaporized source material.

Still further, the utilization of an internal gas pressure regulator provides for assurances that flow from the vaporization vessel ceases when the pressure within the vaporization vessel falls below the desired operating pressure of the gas pressure regulator.

Figure 1:
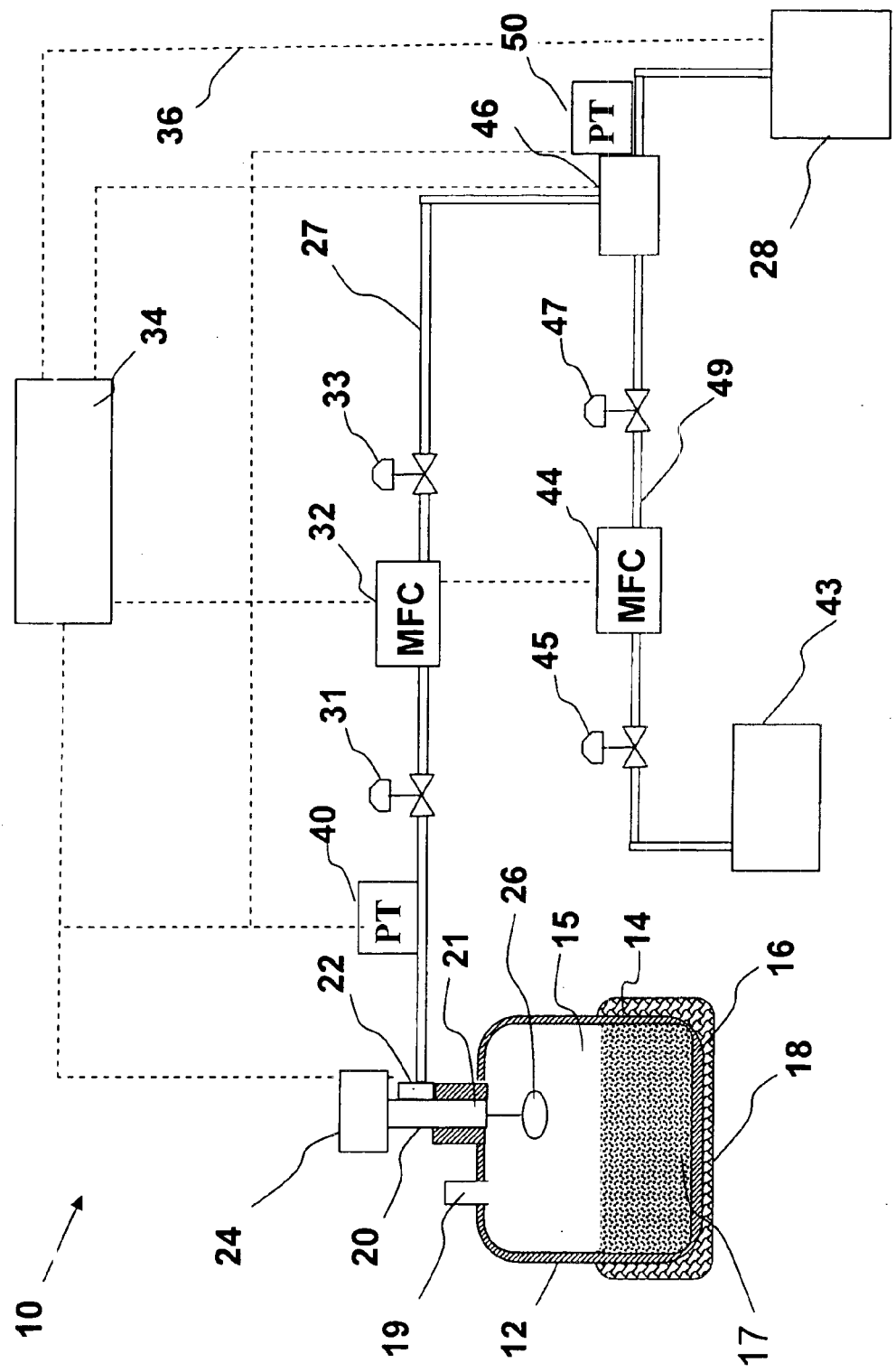
FIG. 1 is a schematic illustration of a system of the present invention.

A sub-atmospheric delivery system in accordance with one embodiment of the present invention and illustrated in FIG. 1 overcomes the deficiencies of prior art delivery systems for vaporized source materials. The sub-atmospheric delivery system 10 comprises a vaporization vessel 12, fabricated of a suitable heat-conducting material, such as for example silver, silver alloys, copper, copper alloys, aluminum, aluminum alloys, lead, nickel clad, stainless steel, graphite and/or ceramic material. The vaporization vessel comprises a bottom 16 and sidewall 14 to form an interior volume 15 for holding a vaporizable source material. The source material may include solid and/or liquid vaporizable material. In the present illustrated embodiment the source material is a solid material 17. The source material can be introduced through fill port 19 before initiation of the vaporization process or can be stored in a reservoir (not shown) and introduced continuously or when required.

Surrounding at least the bottom and a portion of the sidewall of the vessel is a heating device 18. Any heating device that increases the temperature within the vessel to a temperature sufficient to vaporize the desired precursor source material 17 may be used in the present invention. For example, the heating device may include a constant temperature bath, i.e., a water or glycol/water recirculating units.

Disposed in the outlet port 21 of the vessel 12 is a removable valve head assembly comprising primary valve 20 communicating with valve outlet 22, from which vapor is discharged from the vessel. Preferably, the valve 20 is fitted with a flange thereby allowing the opening of the vaporization vessel for recharging or removal and/or replacing of the internal pressure regulator. The valve 20 is in gas flow communication with a gas pressure regulator 26, which may be a conventional type employing a poppet element which may, for example, be spring biased in a closed condition and wherein the poppet is subject to displacement when the pressure differential across the poppet element exceeds a certain level. In the present invention the pressure regulator 26 is set a sub-atmospheric pressure value, e.g., 300 to 700 Torr, and more preferably, about 350 to 450 Torr. The specific pressure level is chosen with respect to the liquid or solid contained in the vessel and as appropriate to the deposition process. Thus, the vaporized source material will not be released from the vaporization vessel until a subatmospheric pressure equal to or less than the set pressure is sensed by the pressure regulator.

In one particular embodiment of the present invention, a vaporizable source material is heated in vessel 12 and the vapors derived therefrom are discharged through the pressure regulator 26 and valve 20 to semiconductor processing tool 28 via vapor connecting line 27. The vapor connecting line 27 includes pressure transducers 40 and 50 to monitor the pressure of vapors flowing through the connecting line and positioned before and after venturi 46. The connecting line further comprises several isolation valves 31 and 33 positioned on opposite sides of a mass flow controller (MFC) 32. The currently illustrated embodiment is horizontally aligned, however, the inventors further contemplate vertical alignment of the individual vaporization vessel and processing tool. Preferably, the length of vapor connecting line 27 that connects the vaporization vessel 12 and processing tool 28 is restricted to a length that maintains the velocity of the flowing vapors therein and reduces condensation of vapor within the connecting line. More preferably, the length of the connecting line between the processing tool and the vaporization vessel is approximately one to six feet, and more preferably from about two to three feet, so that the source of vaporized material is located in close proximity to the processing tool. The length of the vapor connecting line and/or pressure differential between the vaporization vessel and processing tool will determine if the connecting line requires heat tracing. As the length of the connecting line increases, the lines may require additional heating to prevent condensation or deposition of the vaporized source material within the connecting line.

With continuing reference to FIG. 1, the mass flow controller 32 controls the flow of the vaporized source material into the processing tool. Depending on the vaporized source material and the final processing system, the flow of material through the mass flow controller may range from about 1 sccm to 50 sccm, and more preferably from about 1 to about 20 sccm. Positioned in fluid communication with connecting line 27 the (MFC) can accommodate different flow rates, set points and pressures.

The system further comprises venturi 46 positioned in the connecting line 27 between the mass flow controller 32 and the processing tool 28 that acts as a vacuum generator and provides the negative pressure to open the pressure regulator located within the vaporization vessel to release the vaporize source material from the vaporization vessel. Maintaining a reduced sub-atmospheric pressure relative to the pressure of the vapors upstream at the pressure regulator provides for continuous release of the vaporized source materials from the vaporization vessel and reduces the vapor condensation as it flows to the processing tool. Depending on the source material and deposition process, the pressure in the processing tool is preferably at least 50 to 500 Torr less than that upstream to insure a stable, repeatable and accurate flow of the vaporized materials that is unaffected by downstream pressure fluctuations and without forming condensation of vaporized source material in the connecting lines. Preferably, the pressure in the processing tool is maintained at a sub-atmospheric pressure from about $1\times10^{-2}$ Torr to about 760 Torr The venturi 46 also functions as a carrier/diluent gas mixing system to provide a sufficient amount of carrier gas to mix with the vaporized source material before introduction into the processing tool. Carrier gases are added to help insure an even concentration in the processing tool and to power the venturi. A carrier/diluent gas source 43 contains the carrier gas for flowing through the venturi and into the processing tool 28 via carrier gas line 49. Preferably, the carrier/diluent gas is maintained at a pressure in a range from about 40 to about 70 psig and flowed at a rate in a range from about 20 to about 40 slpm. As such, the carrier/diluent gas in line 49 is at a positive pressure. The carrier gas can be flowed through a mass flow controller 44 to insure that the flow of gas is sufficient to provide required concentration of carrier gas/vaporized source material into the processing tool. The carrier/diluent gas line 49 may further comprise isolation valves 45 and 47 positioned before and after the mass flow controller, respectively. Additionally a heating means may be connected to the carrier/diluent gas line to maintain an adequate temperature to ensure the source material remains in a vaporized state.

Any carrier gas may be used in the present system, and preferably, the carrier gas does not chemically react with the vaporized source material thereby reducing formation of unwanted byproducts or deposition of unwanted byproducts within the processing tool.

Figure 3:
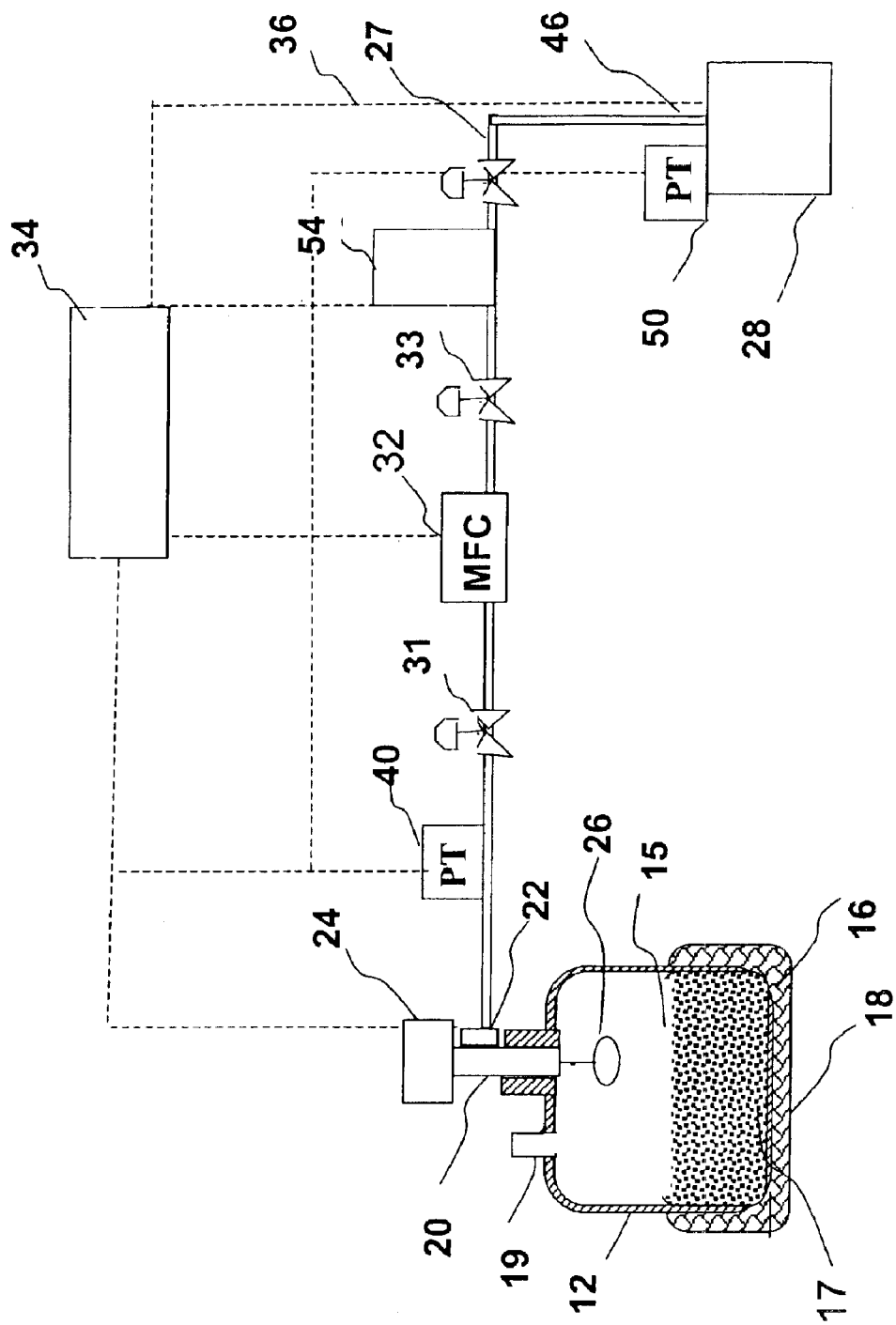
FIG. 3 is a schematic illustration of an alternative embodiment of the present invention.

In an alternative embodiment, as shown in FIG. 3, a vacuum pump 54 is communicatively connected to connecting line 27 which provides the negative pressure to open the pressure regulator located within the vaporization vessel and to release the vaporize source material from the vaporization vessel. Advantageously, the vaporized source material is moved to the processing tool 28, through the MFC, without the need of a carrier gas in either the connecting line 27 or directly into the vaporization vessel.

In operation the vaporized liquid or solid material in vaporizer 12 is heated to a temperature to replace the heat of evaporation or sublimation of the source material and to establish a threshold vapor pressure, e.g., about 10 to about 30 torr. When it is desired to transfer vapors from the vaporization vessel 12, valve actuator 24 is actuated to open valve 20 so that vaporized source material can flow into connecting line 27. This involves opening isolation valves 31 and 33 and activating vacuum generator 46 to communicate with internal pressure regulator 26 thereby permitting vapors derived from the heated source material to flow through the pressure regulator 26 and the valve 20, for egress from the valve head dispensing assembly through outlet 22. The vapors are flowed through vapor connecting line 27 through the mass flow controller and venturi to the processing tool 28.

Concurrently a carrier/diluent gas is introduced to carrier gas line 49, and flowed into the venturi 46 at a pressure and volumetric flow rate to establish a fixed and constant concentration of vaporized source material being flowed into the processing tool.

Accordingly, with continuing reference to FIG. 1, during the operation of gas delivery system, pressure transducers 40 and 50 monitor the pressure in the connecting line 27 between the valve 20 and MFC 32. Under normal operating conditions the pressure measured in PT 40 should be greater than that measured in PT 50 to insure that the gas regulator 26 is opened and vaporized source material is flowed to the processing tool.

Flow of the vapors between the vaporization vessel and processing tool can be controlled by a CPU 34 with input from pressure sensors PT 40 and 50. As shown in FIG. 1 the CPU may be arranged to actuate the valve 20 and/or monitor a process condition in the processing tool, for example measure the pressure within the tool with internal pressure sensors, by means of a signal transmission line 36 which conveys a signal to the CPU, to actuate valve 20 or modulate flow in the MFC 32 or pressure reduction in venturi 46.

Figure 2:
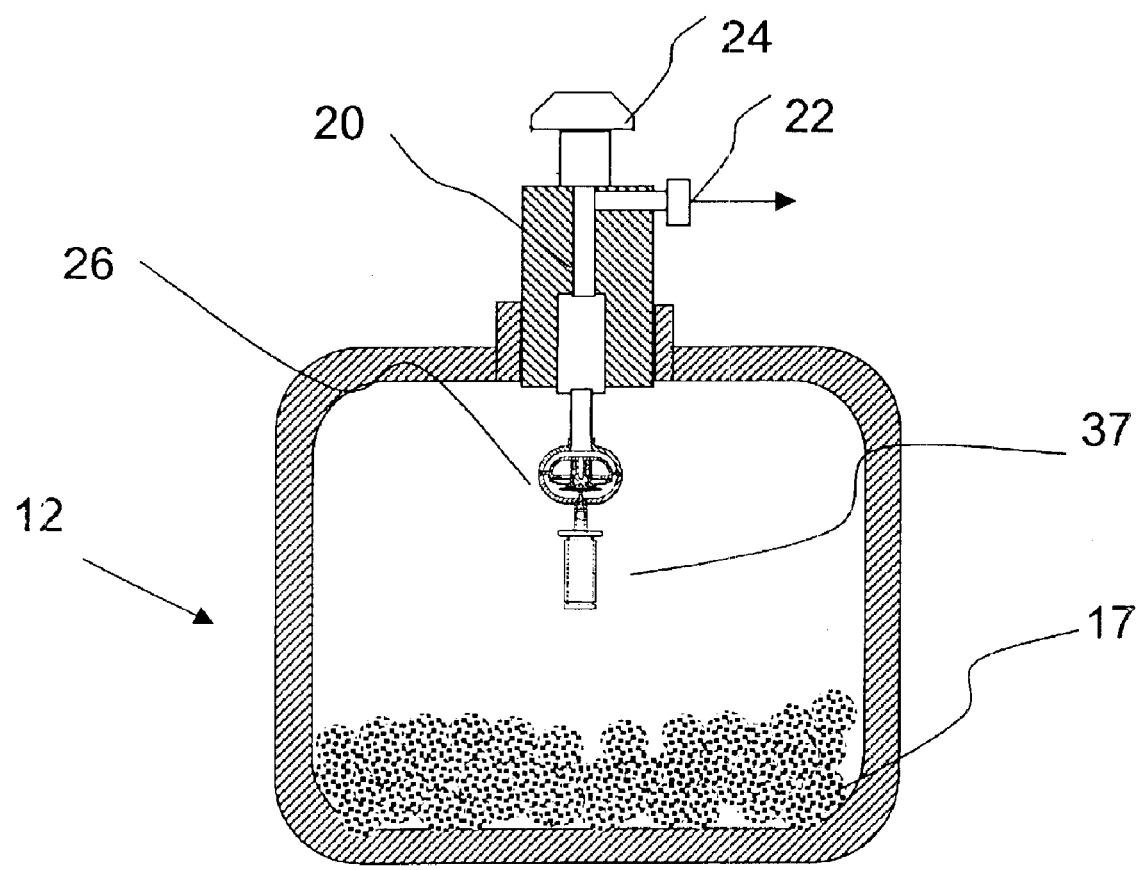
FIG. 2 is a cross-sectional illustration of a vaporization vessel of the present invention.

FIG. 2 illustrates the vaporization vessel 12, containing a solid source material 17, and showing the set pressure regulator 26 (SPR) situated inside the vaporization vessel and upstream from the primary valve 20. The regulator uses an internal pressure-sensing assembly (PSA) and it function is to keep the contents of the vaporization vessel isolated and the pressure regulator is only opened when the downstream pressure equals or is lower than the set pressure threshold. The pressure regulator protects the contents of the vaporization vessel should valve 20 fail. The PSA can be calibrated by backfilling with a helium/argon mixture to a preset pressure. When a pressure below the PSA set point (e.g., 400 Torr) is applied to the downstream side of the SPR, the bellows in the pressure sensing assembly expands, opening a poppet and allowing vapor gas flow through the regulator. The discharge rate is governed by mass flow controller at the process tool. The internal regulator, operating sub-atmospherically, delivers its contents at a constant pressure. Preferred regulators for use in the present invention are commercially available from Swagelok Company, www.swagelok.com.

The present invention may further comprise a diffuser 37 that is coupled with the pressure regulator 26. The diffuser unit has a wall porosity that permits removal of particles greater than a predetermined diameter and may be formed of materials that are capable of withstanding the increased temperature and pressure within the vaporization vessel including high purity stainless or ceramic frits having pore sizes ranging from about 1 to 100 microns. Filter diffuser units of such types are commercially available from Millipore Corporation under the trademark WAFERGUARD. Preferably, the diffuser is a sintered metal filter.

What is claimed is:

1. A vapor delivery system for vaporization and sub-atmospheric delivery of a source material, comprising:
    a) a vaporization vessel enclosing an interior volume that contains a solid or liquid low vapor pressure source material selected from the group consisting of decaborane, hafnium tetrachloride, zirconium tetrachloride, indium trichloride, metalorganic β-diketonate complexes, cyclopentadienylcycloheptatrienyl-titanium ($C_p$TiCht), aluminum trichloride, titanium iodide, cyclooctatetraenecyclo-pentadienyltitanium, biscyclopentadienyl-titaniumdiazide, trimethyl gallium, trimethyl indium, aluminum alkyls, trimethylaluminum, triethylaluminum, trimethylamine alane, tetramethyl tin, diethyl cadmium and tungsten carbonyl, wherein the vaporization vessel includes a heating means for vaporizing said solid or liquid low vapor pressure source material, a fill port for introducing said source material and an outlet port for discharged vaporized source material, and wherein said vaporization vessel is devoid of flow of carrier gas therethrough;
    b) a gas pressure regulator positioned within the vaporization vessel, wherein the gas pressure regulator is set to release vaporized source material at a predetermined sub-atmospheric pressure;
    c) a processing tool positioned downstream from the vaporization vessel;
    d) at least one connecting vapor line positioned between the vaporization vessel and processing tool and in fluid communication therewith;
    e) a mass flow controller in fluid communication with the connecting vapor line to establish a flow rate of the discharged vaporized source material into the downstream processing tool;
    f) a venturi positioned between the processing tool and the mass flow controller and communicatively connected therebetween, wherein the venturi reduces the pressure in the connecting vapor line to a sufficient level to actuate the gas pressure regulator for releasing vaporized source material from the vaporization vessel; and
    g) a carrier/diluent gas line connected to the venturi for introducing a carrier/diluent gas to the venturi thereby mixing the carrier/diluent gas with the vaporized source material before delivery to the processing tool.

2. The vapor delivery system according to claim 1, wherein the connecting vapor line is heated.

3. The vapor delivery system according to claim 1, wherein the low vapor pressure source material comprises a solid material.

4. The vapor delivery system according to claim 3, wherein the connecting vapor line is unheated.

5. The vapor delivery system according to claim 1, wherein the gas pressure regulator is set at a predetermined sub-atmospheric pressure ranging from about 300 Torr to about 600 Torr.

6. The vapor delivery system according to claim 1, wherein the pressure in the processing tool is maintained at a sub-atmospheric pressure from about $1 \times 10^{-2}$ Torr to about 400 Torr.

7. The vapor delivery system according to claim 1, wherein the the solid or liquid low vapor pressure source material in the vaporization vessel is characterized by a temperature at which the threshold vapor pressure of said source material ranges from about 10 to about 30 torr.

8. The vapor delivery system according to claim 1, further comprising at least one pressure sensor communicatively connected to the connecting vapor line.

9. The vapor delivery system according to claim 8, wherein the at least one pressure sensor is communicatively linked to a central processing unit for input of sensed pressure values.

10. The vapor delivery system according to claim 9, wherein the central processing unit is communicatively linked to the mass flow controller for adjustment of flow relative to the sensed pressure in the connecting vapor line.

11. The vapor delivery system according to claim 1, wherein the carrier/diluent gas source is introduced to the connecting vapor line only at the venturi.

12. The vapor delivery system according to claim 1, wherein the carrier/diluent gas line comprises a heating means.

* * * * *